(12) United States Patent
Pelgrom et al.

(10) Patent No.: US 7,538,570 B2
(45) Date of Patent: May 26, 2009

(54) SUPPLY VOLTAGE MONITORING

(75) Inventors: Marcel Pelgrom, Helmond (NL);
Violeta Petrescu, Vosselaar (BE);
Hendrickus Joseph Maria Veendrick, Heeze (NL)

(73) Assignee: NXP B.V., Eindhoven (NL)

( * ) Notice: Subject to any disclaimer, the term of this patent is extended or adjusted under 35 U.S.C. 154(b) by 105 days.

(21) Appl. No.: 11/912,525

(22) PCT Filed: Apr. 20, 2006

(86) PCT No.: PCT/IB2006/051214
§ 371 (c)(1),
(2), (4) Date: Oct. 25, 2007

(87) PCT Pub. No.: WO2006/114727
PCT Pub. Date: Nov. 2, 2006

(65) Prior Publication Data
US 2008/0191732 A1 Aug. 14, 2008

(30) Foreign Application Priority Data
Apr. 25, 2005 (EP) .................. 05103336

(51) Int. Cl.
*G01R 31/36* (2006.01)
*G01R 31/02* (2006.01)
(52) U.S. Cl. .................. 324/771; 324/765; 324/141; 324/158.1; 324/522

(58) Field of Classification Search ......... 324/140–142, 324/552, 765, 771
See application file for complete search history.

(56) References Cited

U.S. PATENT DOCUMENTS

| 5,703,486 A | 12/1997 | Arai et al. |
| 6,262,567 B1 | 7/2001 | Bartlett |
| 6,456,086 B1 * | 9/2002 | Bolz et al. .................. 324/522 |
| 2004/0263216 A1 * | 12/2004 | Proll et al. .................. 327/78 |
| 2008/0089143 A1 * | 4/2008 | Do .................. 365/189.09 |

FOREIGN PATENT DOCUMENTS

WO 2006056898 A1 6/2006

OTHER PUBLICATIONS

Black B "Analog-to-Digital Converter Architectures and Choices for System Design" Analog Dialogue Analog Devices USA, vol. 33, No. 8, Sep. 1999, pp. 4.

* cited by examiner

*Primary Examiner*—Ha Tran T Nguyen
*Assistant Examiner*—Emily Y Chan

(57) ABSTRACT

An integrated circuit is provided with a distributed supply voltage monitoring system in which a single controller controls a plurality of voltage monitors located in respective modules of the integrated circuit. The controller and each circuit form a successive approximation analogue to digital converter Such a system enables a small size monitoring circuit to be realized for every module of the integrated circuit.

16 Claims, 6 Drawing Sheets

SUPPLY VOLTAGE MONITORING

FIELD OF THE INVENTION

The present invention relates to supply voltage monitoring, and in particular, to supply voltage monitoring in CMOS (complementary metal oxide semiconductor) integrated circuits.

BACKGROUND OF THE INVENTION

Advances in manufacturing technology have enabled larger and denser circuits to be placed on single semi-conductor integrated circuits. This is especially the case when the circuits are realized as regular or cellular structures, for example Random Access Memory. A major problem associated with high density device is that of testing. In order to maintain higher reliability, device test procedures need to provide good coverage of possible faults that occur in the integrated circuit.

One technique for providing testing of an integrated circuit is the so-called SIST architecture (signal integrity self-test architecture). The purpose of SIST architecture is to allow real time monitoring of important parameters which characterize the electrical behaviour of the integrated circuit. For example, monitors can be provided to detect cross talk, supply noise, substrate noise, temperature, switching activity, clock duty cycle etc. An SIST architecture has the advantage that testing can be performed before use during a test and debug process, and also during use (on-line).

FIG. 1 of the accompanying drawings is a block diagram illustrating an integrated circuit including previously considered Signal Integrity Self Test (SIST) architecture. The integrated circuit 100 comprises a number of functional cores or modules 200. These modules may perform analogue, digital or memory functions. For simplicity, it has been assumed that all cores are the same size. It will be readily appreciated that such techniques are not limited to an integrated circuit having cores of the same size. In addition, the normal interconnections and buses, which perform communication controls between the different functional cores, have been omitted from the diagram for the sake of clarity.

The integrated circuit 100 includes a monitor control block 400 which communicates with a number of monitors (not shown in FIG. 1) using a monitor selection bus 600. A reference and compare circuit 800 outputs a self-test signal from an output 1000 in dependence upon received signals from the monitors. The monitors supply monitor output signals via a bus structure 1200. The monitors are intended to be designed as standard cells, so that they can be located anywhere within each standard-cell block.

FIG. 2 of the accompanying drawings illustrates a functional core 200 from the integrated circuit of FIG. 1. The core 200 includes a plurality of monitors 1600 connected to a decoder 1400 and to the bus structure 1200. In FIG. 2, the functional blocks relating to the function of the core have been omitted for the sake of clarity. FIG. 2 illustrates an exemplary core having four monitors 1600. It will be readily appreciated that the core can be provided with any number of monitors in dependence upon the parameters to be measured. As mentioned above, different sensors are used to monitor different phenomena: cross talk, supply noise, substrate noise, temperature, switching activity, clock duty-cycle, etc.

The SIST architecture (FIG. 1) allows access to each individual monitor in a core using the monitor selection bus 600, which is controlled by the monitor control block 400. The monitor control block 400 includes a memory, which contains specific codes through which a certain monitor in a specific core can be selected. The output of the selected monitor is usually converted to a DC value or into a differential signal, which is then connected to the bus structure 1200. This bus structure 1200 may either be connected directly to a bondpad 1000 of the integrated circuit, or, as shown, it may be connected to the reference and compare circuit 800. In one particular example, the reference and compare circuit 800 operates to determine whether the output signal from the monitor is within a certain allowed range. The reference and compare block 800 may contain reference values for each kind of monitor.

The monitor control block 400 can be placed on the integrated circuit, but can also be an external controller, for example a software program or an analysis tool. In all cases, it is necessary to provide a means to communicate between all monitors 1600 and the monitor control block 400.

The continued reduction of feature sizes in deep sub micron CMOS has led to integrity problems in advanced digital CMOS circuits.

One of the integrity problems is associated with the power supply, the ground return path and the substrate potential. Voltage drops can already be detected in the layout phase. However, temporary dips on power supplies, or bounces on ground and substrate have a very local character, and are difficult to predict or determine in a device under test. Therefore, "signal integrity self test" (SIST) monitors aim at measuring and reporting these temporary voltage fluctuations.

Measuring voltage excursions (such as dips or bounces) is a very common problem and existing solutions are available. In the case of a digital CMOS integrated circuit, however, some constraints limit the possibilities for proper measurement:

Feeding additional lines to the points of interest and measuring on the outside of the chip, is not possible: because the wires would pick up signals that do not exist at the measurement points and additional external pins are needed.

Building a full Analog to Digital converter to provide a digital signal representing the voltage measurement would cost too much IC area and post additional power constraints on the circuit.

It is, therefore, an object of the present invention to provide an improved voltage measurement apparatus for such integrated circuits.

SUMMARY OF THE PRESENT INVENTION

According to one aspect of the present invention, there is provided a supply voltage monitoring apparatus for use in an integrated circuit having a module. The apparatus comprises a controller; and a monitoring circuit including a low pass filter connected to receive a supply voltage as an input signal and operable to output an average supply voltage signal; a digital-to-analogue converter connected to receive the average supply voltage signal from the low pass filter, and operable to output an analogue output signal; and a comparator connected to receive the analogue output signal from the digital-to-analogue converter and to receive a measurement voltage signal, and operable to produce a comparison signal for supply to the controller, the comparison signal being related to a comparison of the analogue and supply voltage signals. The monitoring circuit is provided in the module of the integrated circuit, and the controller is connected to control the monitoring circuit.

Such an apparatus enables measurements to be taken close to the voltage supply point of interest, while reducing the integrated circuit area taken up by the measurement apparatus.

The apparatus may comprise a plurality of monitoring circuits located in respective modules of the integrated circuit. In such an example, the controller is connected to receive comparison signals from respective monitoring circuits in turn, and operable to supply control signals to the monitoring circuits in turn, the control signals being related to the associated comparison signal.

The measurement voltage signal can be a supply voltage signal. The supply voltage signal can be supplied to the comparator directly, or via a voltage divider circuit or level shifter circuit. In the latter case, an embodiment of the present invention can provide measurements of supply overshoot.

The measurement voltage signal could be a substrate voltage signal, with the comparator is connected to receive the measurement voltage signal via a level shifter circuit. Such an embodiment can provide measurements of substrate voltage noise.

Another aspect of the present invention provides an integrated circuit including a measurement apparatus as described above.

These and other aspects of the present invention will be apparent from the description of the preferred embodiments described below.

DETAILED DESCRIPTION OF THE PREFERRED EMBODIMENTS

Embodiments of the present invention make use of a distributed approach. A measurement device is located close to the desired measurement point on the integrated circuit. In such embodiments, a comparator is located close to the measurement point, in order to compare the current supply voltage measurement with an average value of supply voltage produced by a filter and digital to analogue converter (DAC). Control by the DAC is provided by a controller which is located away from the measurement points. The controller is common to a plurality of measurement DACs, and can communicate with the DACs. In one possible example, a communications line connects the monitoring circuits to one another to form a series. The first and last monitoring circuits in the series are connected to the controller. The communications line may be a single bit line.

Figure 1:
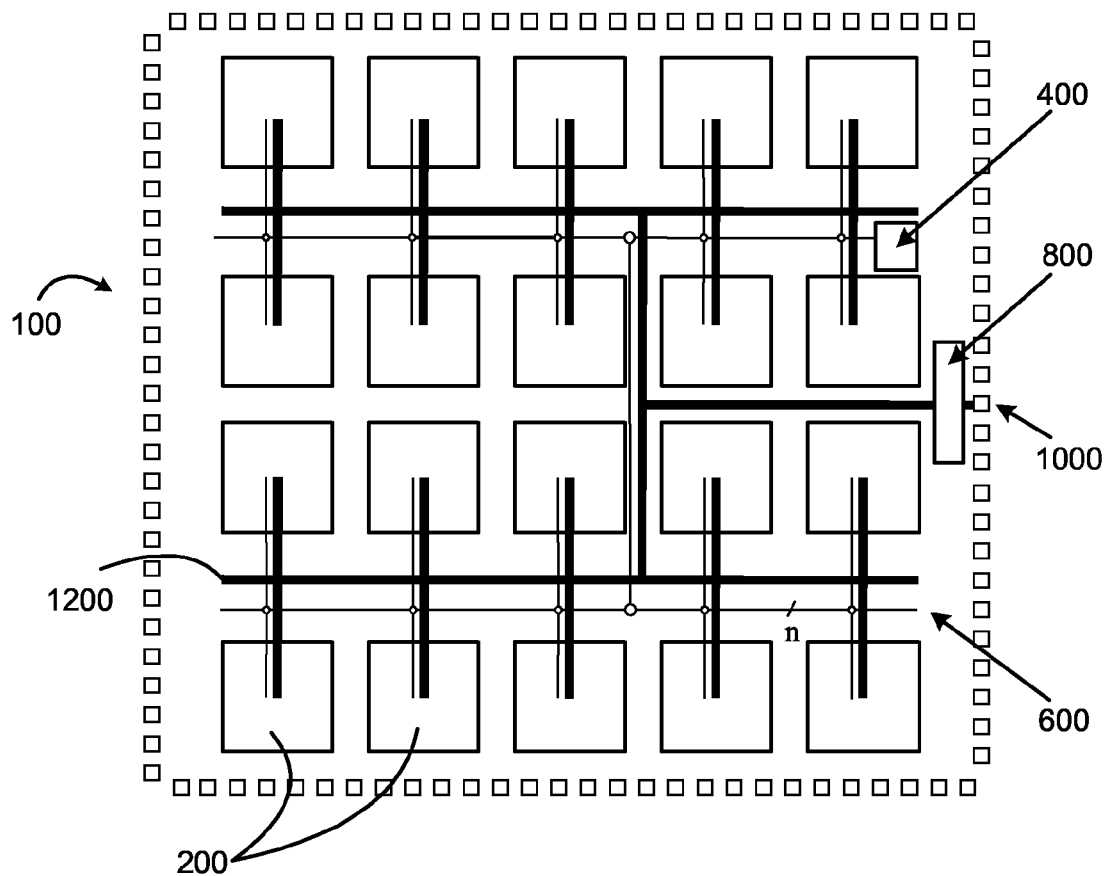
FIG. 1 is a block diagram illustrating a SIST architecture of an integrated circuit.
Figure 2:
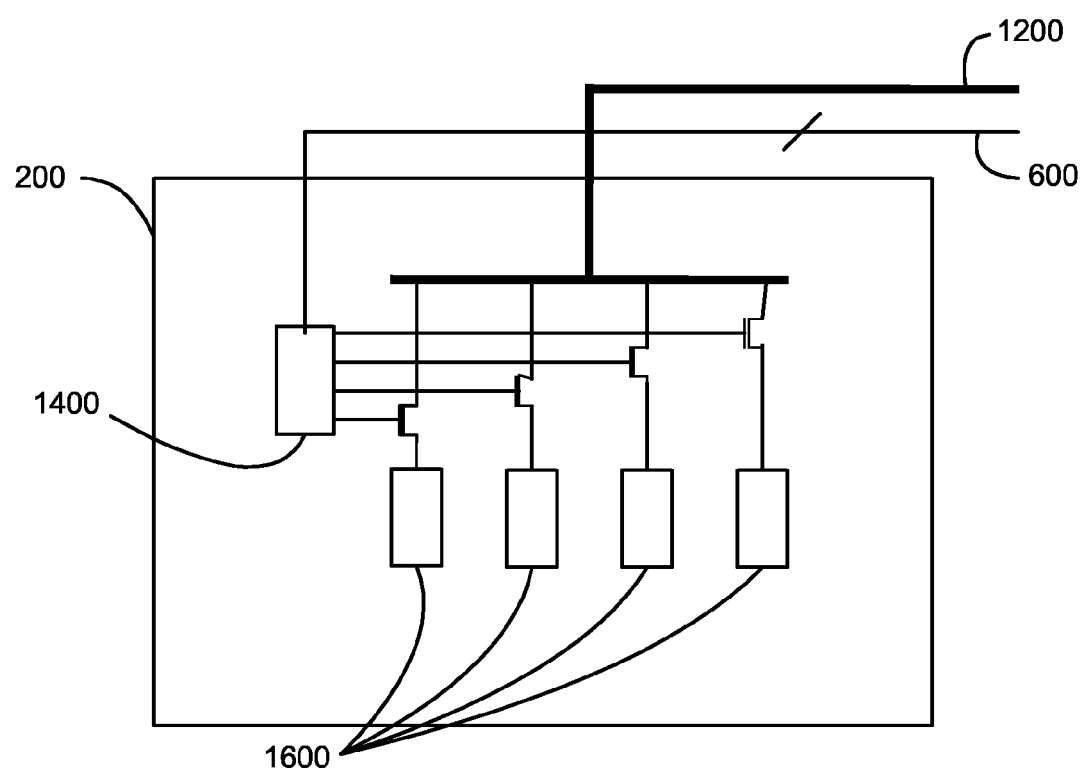
FIG. 2 is a block diagram illustrating a functional core of the architecture of FIG. 1.
Figure 3:
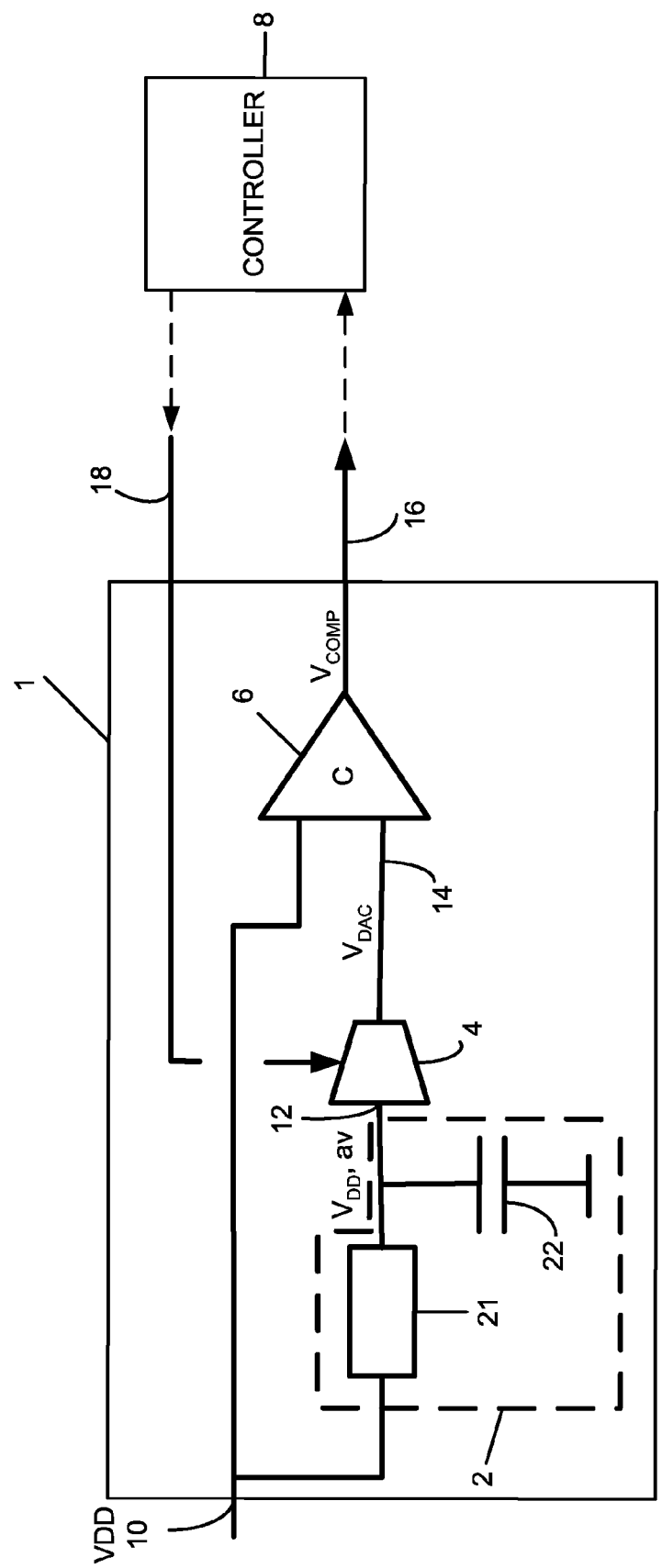
FIG. 3 illustrates part of a supply monitoring system embodying the present invention.

FIG. 3 illustrates a supply monitoring system embodying one aspect of the present invention. The system comprises a controller 8 and a monitoring circuit 1 which includes a low pass filter 2 (in the embodiment shown comprising a resistor 21 and capacitor 22, an RC network), a digital-to-analog converter (DAC) 4 connected to receive the output of the low pass filter 2, and a comparator 6.

The low pass filter 2 receives the supply voltage VDD 10 as an input signal, and produces an average VDD signal 12 (VDD,av). The average signal 12 is supplied to the digital-to-analog converter 4, which produces a DAC signal VDAC 14. The comparator 6 receives the DAC signal 14 and compares that signal with the original supply voltage VDD 10 to produce a comparison output signal 16. The comparison signal VCOMP 16 is supplied to the controller 8. The controller 8 operates to control the setting of the DAC using a control signal 18. The DAC is operated using a successive approximation technique in order to generate an appropriately resolved approximation of the VDD average signal.

FIG. 3 illustrates a single monitoring circuit connected with the controller 8 for the sake of clarity. It will be readily appreciated that each module on the integrated circuit may be provided with a monitoring circuit that communicates with the controller 8.

In one particular example, the monitoring circuits are chained together to form a series of connected circuits, each able to communicate with its neighbouring circuit or circuits. The first and last circuits in such a series are connected to communicate with the controller 8. In such a case, a control signal that is supplied to the monitoring circuits by the controller 8 must be passed around the monitoring circuit series until it reaches the intended circuit. The intended circuit can then output its comparison signal to the controller 8, via the remaining circuits in the series.

Figure 4:
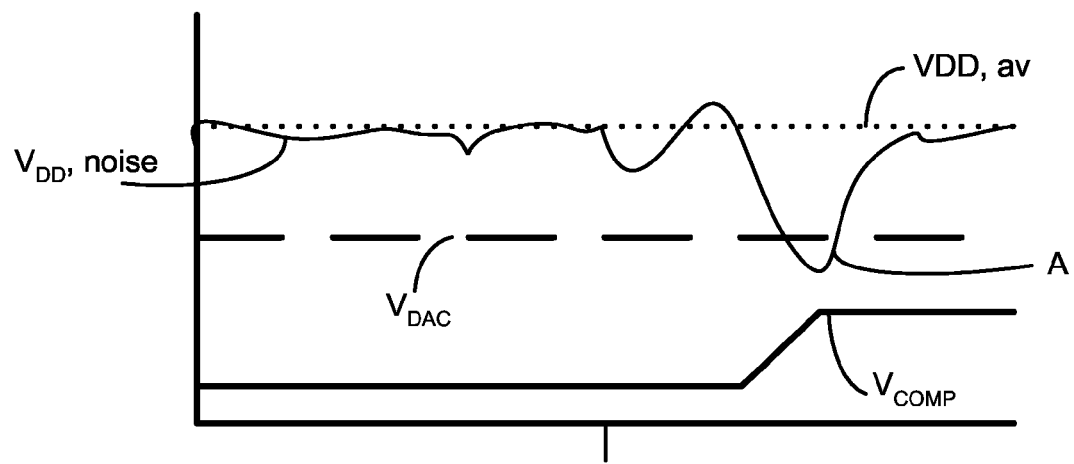
FIG. 4 illustrates operation of the system of FIG. 1.

FIG. 4 illustrates the signals VDD, VDD average, VDAC and VCOMP (10, 12, 14, 16). As can be seen from FIG. 4, when the supply voltage VDD suffers a momentary dip (indicated at A), the comparison signal VCOMP changes, thereby indicating this drop to the controller. The successive approximation technique enables the magnitude of the dip in supply voltage to be measured. By using the average supply voltage as a reference point, the comparison signal will relate to the relative change in supply voltage. This in turn removes the need for a local accurate supply voltage measurement.

In this case, the quantity to be measured is the noisy Vdd. The absolute value of this voltage is not so important, however the spike determines the reliability of the digital circuit. This spike is measured with respect to the average value of the noisy power supply. A local filter generates this value; here a simple R-C network is used, other options certainly are also feasible. The Digital to Analog converter in this circuit subdivides this value and can be set by the control mechanism (the successive approximation loop). As the expected voltage resolution lies in the 10-20 mV range, an R-2R scheme can be used. An additional variant exist where the filtering resistor and capacitor form elements of the DA converter.

Figure 5:
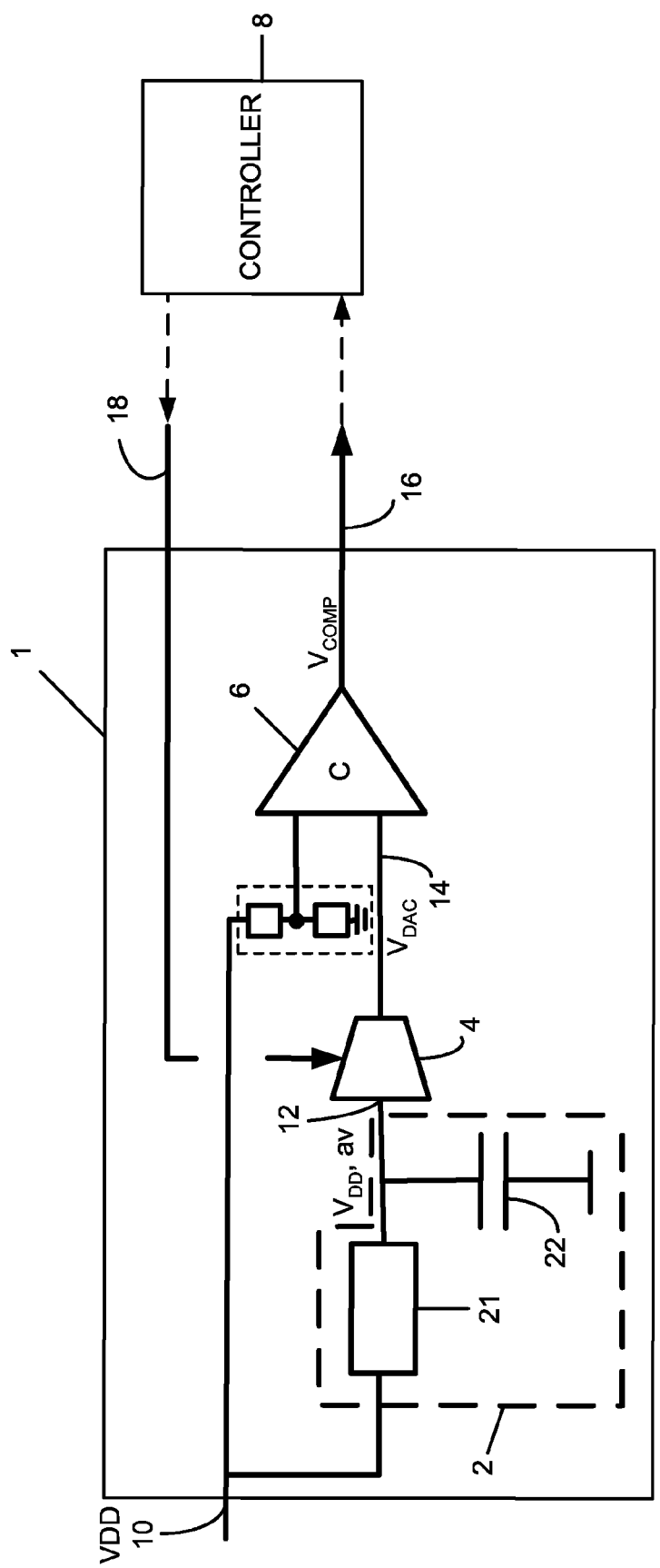
FIG. 5 illustrates a modified version of the system of FIG. 3.

FIG. 5 illustrates a modified version of the embodiment of FIG. 3, for measuring power supply overshoot. A voltage divider 30 is connected between the power supply rail and the comparator. The example shown in FIG. 5 is a series connection of two resistors connected between the power supply rail 10 and ground, with a central connection connected to one input of the comparator. Alternatively, it would be possible to use a level shifter in place of the voltage divider. The inputs to the comparator need to be reversed when compared to the FIG. 3 circuit, in order to obtain a similar decision polarity. Alternatively, an inverter should be added after the output of the comparator. Operation of the circuit of FIG. 5 is identical to that of FIG. 3.

Figure 6:
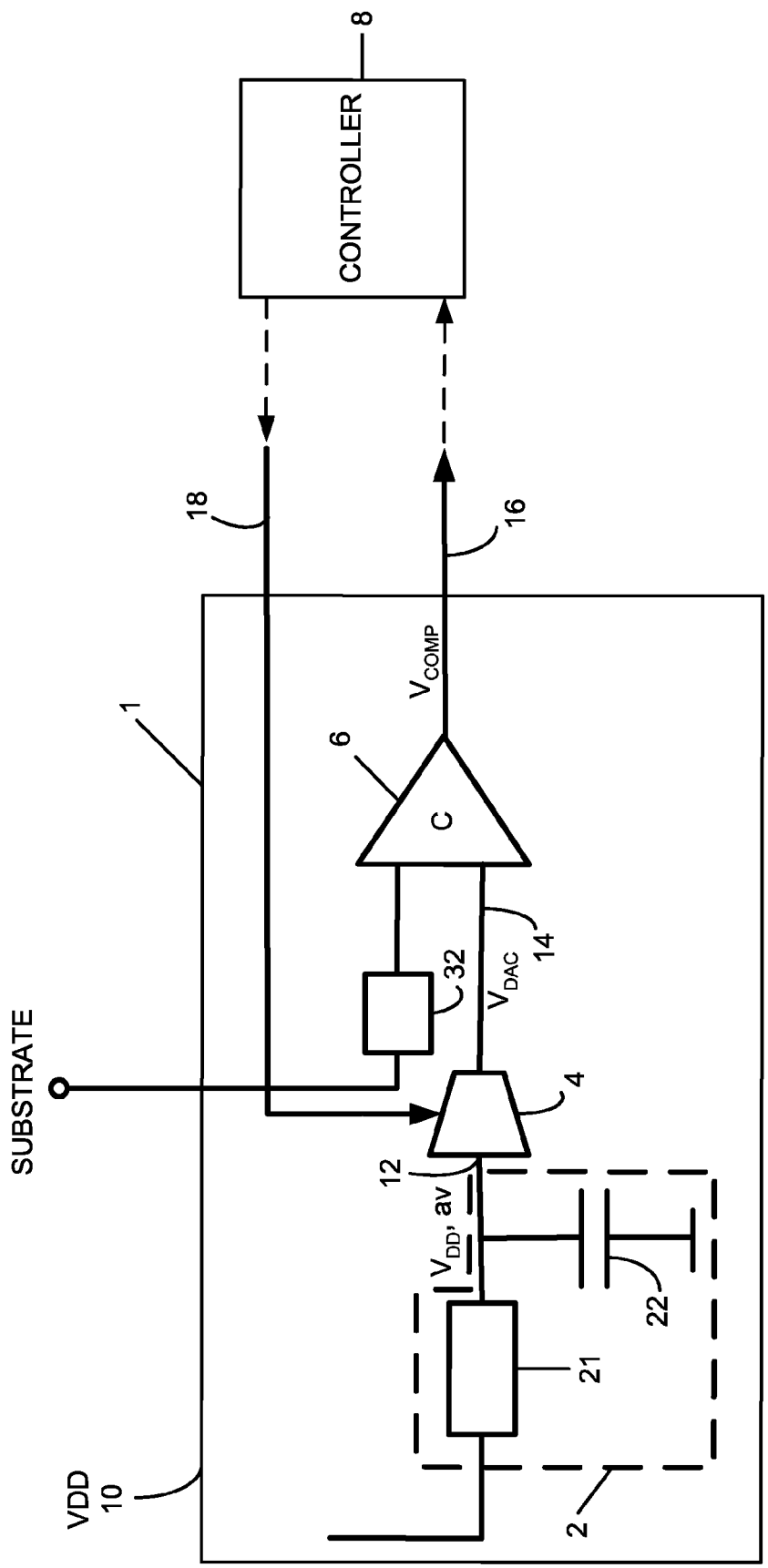
FIG. 6 illustrates another modified version of the system of FIG. 3.

FIG. 6 illustrates another modified circuit, for measuring substrate noise. The differences between the FIG. 6 circuit and that of FIG. 3 are as follows. The connection between the power supply rail and the comparator is replaced by a connection to the substrate, via a level shifter 32. In order to obtain a correct output from the comparator, a second level can be added between the output of the DAC 4 or a "quiet" measurement of the substrate must be taken in order to allow correction of the level shifted voltage. Operation of the FIG. 6 circuit is then the same as that described for FIG. 3.

The previously described modes for measuring power supply dips and spikes as well as substrate disturbances or disturbances on other bias or supply lines can be combined. As set of switches can set-up the required connections for each of the aforementioned modes. The control of these switches can be carried out by the controller. The control signals from the controller to the switches can be transported via a bus structure, or via a shift register control or by any other means known to the skilled engineer.

The advantages of some embodiments of this monitor are:

the measurement unit is small in size, so that it can be embedded into a digital core module no need for additional wiring except for the one-wire data bus extendable to measurement of positive and negative excursions and for supply and ground terminals.

It should be noted that the above-mentioned embodiments illustrate rather than limit the invention, and that those skilled in the art will be capable of designing many alternative embodiments without departing from the scope of the invention as defined by the appended claims. In the claims, any reference signs placed in parentheses shall not be construed as limiting the claims. The words "comprising" and "comprises", and the like, do not exclude the presence of elements or steps other than those listed in any claim or the specification as a whole. The singular reference of an element does not exclude the plural reference of such elements and vice-versa. The invention may be implemented by means of hardware comprising several distinct elements, and by means of a suitably programmed computer, if appropriate. In a claim enumerating several means, several of these means may be embodied by one and the same item of hardware. The mere fact that certain measures are recited in mutually different dependent claims does not indicate that a combination of these measures cannot be used to advantage.

The invention claimed is:

1. A supply voltage monitoring apparatus for use in an integrated circuit having a module, the apparatus comprising:
   a controller; and a monitoring circuit including: a low pass filter connected to receive a supply voltage as an input signal and operable to output an average supply voltage signal;
   a digital-to-analogue converter connected to receive the average supply voltage signal from the low pass filter, and operable to output an analogue output signal; and
   a comparator connected to receive the analogue output signal from the digital-to-analogue converter and to receive a measurement voltage signal, and operable to produce a comparison signal for supply to the controller, the comparison signal being related to a comparison of the analogue and supply voltage signals,
      wherein the monitoring circuit is provided in the module of the integrated circuit, and the controller is connected to control the monitoring circuit.

2. Apparatus as claimed in claim 1 for use in an integrated circuit having a plurality of modules, the apparatus comprising a plurality of monitoring circuits located in respective modules of the integrated circuit.

3. Apparatus as claimed in claim 2, wherein the controller is connected to receive comparison signals from respective monitoring circuits in turn, and operable to supply control signals to the monitoring circuits in turn, the control signals being related to the associated comparison signal.

4. Apparatus as claimed in any claim 1, wherein the measurement voltage signal is a supply voltage signal.

5. Apparatus as claimed in claim 4, wherein the comparator is connected to receive the measurement voltage signal via a voltage divider circuit.

6. Apparatus as claimed in claim 4, wherein the comparator is connected to receive the measurement voltage signal via a level shifter circuit.

7. Apparatus as claimed in claim 1, wherein the measurement voltage signal is a substrate voltage signal, and the comparator is connected to receive the measurement voltage signal via a level shifter circuit.

8. An integrated circuit comprising: a plurality of modules; and a supply voltage monitoring circuit which comprises: a controller and a plurality of monitoring circuits, each including: a low pass filter connected to receive a supply voltage as an input signal and operable to output an average supply voltage signal; a digital-to-analogue converter connected to receive the average supply voltage signal from the low pass filter, and operable to output an analogue output signal; and a comparator connected to receive the analogue output signal from the digital-to-analogue converter and to receive a measurement voltage signal, and operable to produce a comparison signal for supply to the controller, the comparison signal being related to a comparison of the analogue and supply voltage signals, wherein the monitoring circuits are provided in respective modules of the integrated circuit, and the controller is connected to control the monitoring circuits.

9. An integrated circuit as claimed in claim 8, wherein the monitoring circuits are connected together in series for transfer of signals between neighboring circuits in the series, the first and last circuits in the series being connected to transfer signals with the controller.

10. An integrated circuit as claimed in claim 9, wherein the controller is operable to transmit a control signal to the first circuit in the series, and each circuit, except the last in the series, is operable to relay that control signal to the next circuit in the series.

11. An integrated circuit as claimed in claim 10, wherein each circuit is operable to receive a control signal and determine if that control signal is intended for the circuit concerned, and, if that is the case, to transfer a comparison signal to the next circuit in the series, or to the controller.

12. An integrated circuit as claimed in any claim 9, wherein the monitoring circuits are connected with one another and/or with the controller via a single data bit line.

13. Apparatus as claimed in claim 8, wherein the measurement voltage signal is a supply voltage signal.

14. Apparatus as claimed in claim 12, wherein the comparator is connected to receive the measurement voltage signal via a voltage divider circuit.

15. Apparatus as claimed in claim 12, wherein the comparator is connected to receive the measurement voltage signal via a level shifter circuit.

16. Apparatus as claimed in claim 8, wherein the measurement voltage signal is a substrate voltage signal, and the comparator is connected to receive the measurement voltage signal via a level shifter circuit.

* * * * *